(12) United States Patent
Cho

(10) Patent No.: US 8,345,173 B2
(45) Date of Patent: Jan. 1, 2013

(54) THIN FILM TRANSISTOR SUBSTRATE, DISPLAY DEVICE HAVING THE SAME AND METHOD OF MANUFACTURING THE SAME

(75) Inventor: Se-Il Cho, Suwon-si (KR)

(73) Assignee: Samsung Display Co., Ltd. (KR)

( * ) Notice: Subject to any disclaimer, the term of this patent is extended or adjusted under 35 U.S.C. 154(b) by 519 days.

(21) Appl. No.: 12/049,977

(22) Filed: Mar. 17, 2008

(65) Prior Publication Data

US 2009/0091698 A1 Apr. 9, 2009

(30) Foreign Application Priority Data

Oct. 8, 2007 (KR) .................. 10-2007-0100783

(51) Int. Cl.
*G02F 1/1335* (2006.01)
*G06F 3/041* (2006.01)
(52) U.S. Cl. .......................... 349/12; 345/173
(58) Field of Classification Search .............. 349/12; 345/173–178
See application file for complete search history.

(56) References Cited

U.S. PATENT DOCUMENTS

| 2007/0070047 A1* | 3/2007 | Jeon et al. ............ 345/173 |
| 2008/0018613 A1* | 1/2008 | Kim et al. ............ 345/173 |
| 2008/0186288 A1* | 8/2008 | Chang .................. 345/174 |

FOREIGN PATENT DOCUMENTS

| JP | 2006-011522 | 1/2006 |
| KR | 1020040043958 | 5/2004 |
| KR | 1020070034720 | 3/2007 |

* cited by examiner

*Primary Examiner* — Mark Robinson
*Assistant Examiner* — Michael Inadomi
(74) *Attorney, Agent, or Firm* — Innovation Counsel LLP

(57) ABSTRACT

A display substrate includes a first sensor line substantially parallel with the gate line or the data line, a first protrusion portion protruded from the first sensor line, and a first sensor electrode electrically connected to the first protrusion portion. The first sensor electrode includes a malleable metal. The malleable metal can overcome pressure and elastic deformation. Thus, the sensor electrode made from the malleable metal is not easily damaged by pressing the sensor electrode repeatedly.

12 Claims, 7 Drawing Sheets

THIN FILM TRANSISTOR SUBSTRATE, DISPLAY DEVICE HAVING THE SAME AND METHOD OF MANUFACTURING THE SAME

This application claims priority to Korean Patent Application No. 2007-100783, filed on Oct. 8, 2007, and all the benefits accruing therefrom under 35 U.S.C. §119, the contents of which in its entirety are herein incorporated by reference.

BACKGROUND OF THE INVENTION

1. Field of the Invention

The invention relates to a thin film transistor substrate, a display device having the thin film transistor substrate and a method of manufacturing the same. More particularly, the invention relates to a thin film transistor substrate capable of enduring repetitive pressing, a display device having the thin film transistor substrate, and a method of manufacturing the same.

2. Description of the Related Art

Liquid crystal display devices are known to have characteristics, such as lightweight, lower power consumption, lower driving voltage, etc., in comparison with other display apparatuses, rendering them useful in monitors, notebook computers, cellular phones, etc. The liquid crystal display device includes a liquid crystal display panel displaying images using a light transmitting ratio of liquid crystal molecules and a backlight assembly disposed below the liquid crystal display panel to provide the liquid crystal display panel with light.

The liquid crystal display panel includes a thin film transistor substrate, an opposite substrate and a liquid crystal layer. The thin film transistor substrate includes a signal line, a thin-film transistor, and a pixel electrode. The opposite substrate faces the thin film transistor substrate and includes a common electrode. The liquid crystal layer is interposed between the thin film transistor substrate and the opposite substrate.

The liquid crystal display panel may have a touch panel function capable of receiving position data through an external pressure. That is, when an electronic pen or a finger touches a screen of the liquid crystal display panel, a position data signal may be applied to a central processing unit of a main system.

The liquid crystal display panel further includes a sensor line and a sensor electrode part to perform the touch panel function. Particularly, the sensor line is formed on the thin film transistor substrate and is spaced apart from the signal line, and the sensor electrode part is formed in a unit pixel to be electrically connected to the signal line. When the common electrode makes contact with the sensor electrode part by applying an external pressure to the opposite substrate, position data corresponding to the contact position is provided to the central processing unit through the sensor line to perform an operation.

However, when the operation of pressing and pulling the touch panel is repeatedly performed, a persistent pressure is loaded to the sensor electrode part. Then, the sensor electrode part may be damaged by the pressure, breaking the sensor electrode so that the signal is not transmitted. The break in the sensor electrode acts as an open circuit which is unable to transmit the signal.

BRIEF SUMMARY OF THE INVENTION

An exemplary embodiment of the invention provides a thin film transistor substrate capable of enduring repetitive pressing.

Another exemplary embodiment of the invention also provides a display device having the thin film transistor substrate.

In one aspect of the invention, a display substrate includes a first sensor line, a first protrusion portion protruded from the first sensor line, and a first sensor electrode electrically connected to the first protrusion portion. The first sensor electrode includes a malleable metal.

In another aspect of the invention, a thin film transistor substrate includes an insulating plate, a gate line formed on the insulating plate, a data line crossing the gate line, a thin film transistor connected to the gate line and the data line, a first sensor line substantially parallel with the gate line, a first protrusion portion protruded from the first sensor line, a first contact assistant member in direct contact with the first protrusion portion, and a first sensor electrode contacting the first contact assistant member.

In still another aspect of the invention, a thin film transistor substrate includes a first insulating plate, a gate line formed on the first insulating plate, a data line crossing the gate line, a thin film transistor connected to the gate line and the data line, a first sensor line substantially parallel with the gate line, a first protrusion portion protruded from the first sensor line, a first sensor electrode electrically connected to the first protrusion portion, a second sensor line substantially parallel with the data line, a second protrusion portion protruded from the second sensor line, a second sensor electrode electrically connected to the second protrusion portion, a second insulating plate, an organic layer formed on the second insulating plate, a third protrusion portion vertically protruded from the organic layer, and a common electrode formed on the organic layer and on the protrusion. The first sensor electrode includes a malleable metal and the second sensor electrode includes a malleable metal.

According to one aspect of the invention, a gate line, a first sensor line and a first protrusion portion protruded from the first sensor line are formed on an insulating plate. A gate insulating layer is formed on the gate line, the first sensor line and the first protrusion portion. A data line, a second sensor line and a second protrusion portion protruded from the second sensor line are formed on the gate insulating layer. A passivation layer is formed on the data line, the second sensor line and the second protrusion portion. A first sensor electrode and the second sensor electrode are formed on the passivation layer.

According to the invention, the sensor electrode includes a malleable metal. The malleable metal can overcome pressure and elastic deformation. Thus, the sensor electrode made from the malleable metal is not easily damaged by pressing the sensor electrode repeatedly.

BRIEF DESCRIPTION OF THE DRAWINGS

The above and other aspects, features, and advantages of the invention will become readily apparent by reference to the following detailed description when considered in conjunction with the accompanying drawings wherein.

DETAILED DESCRIPTION OF THE INVENTION

Figure 1:
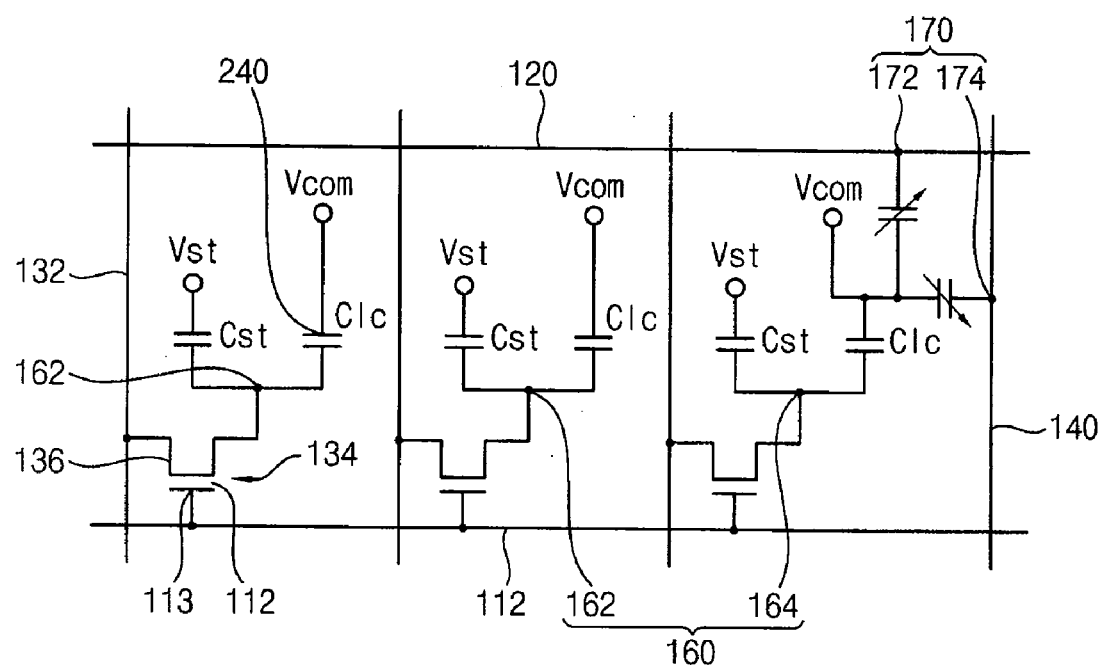
FIG. 1 is a circuit diagram illustrating a thin film transistor substrate according to one embodiment.

The invention now will be described more fully hereinafter with reference to the accompanying drawings, in which exemplary embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the invention are described herein with reference to cross section illustrations which are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the invention.

Hereinafter, the exemplary embodiments of the invention will be described in detail with reference to the accompanying drawings.

FIG. 1 is a circuit diagram illustrating a thin film transistor substrate according to one embodiment.

Referring to FIG. 1, a thin film transistor substrate according to an exemplary embodiment of the invention includes a plurality of gate lines 112 formed in a first direction. A plurality of the data lines 132 are formed in a second direction. A thin film transistor 134 is connected to the gate line 112 and the data line 132. The thin film transistor 134 includes a gate electrode 113, a source electrode 136 and a drain electrode 138.

The gate electrode 113 is electrically connected to the gate line 112 and the source electrode 136 is electrically connected to the data line 132. The drain electrode 138 is electrically connected to a pixel electrode 160. The pixel electrode 160 includes a first pixel electrode 162 that is not adjacent to a sensor electrode part 170 and a second pixel electrode 164 that is adjacent to the sensor electrode part 170.

The pixel electrode 160 and the common electrode 240 may form a liquid crystal capacitor Clc, and the pixel electrode 160 and the storage line (not shown) may form a storage capacitor Cst. The common electrode 240 receives a common voltage Vcom, and the storage line 114 receives a storage voltage Vst.

The first sensor line 120 is formed to be substantially parallel with the gate line 112. The second sensor line 140 is spaced apart from the data line 132 and is substantially parallel with the data line 132. The first sensor line 120 and the second sensor line 140 are connected to an external sensing part (not shown). The first sensor line 120 senses the Y coordinate value of a touched portion and the second sensor line senses the X coordinate value of a touched portion. The first sensor line 120 and the second sensor line 140 are electrically connected to the sensor electrode part 170. The sensor electrode part 170 includes a first sensor electrode 172 and a second sensor electrode 174. In particular, the first sensor line 120 is electrically connected to the first sensor electrode 172, and the second sensor line 140 is electrically connected to the second sensor electrode 174.

During the non-touching operation time, the common electrode 240 is physically spaced apart from the first sensor electrode 172, and the common electrode 240 is physically spaced apart from the second sensor electrode 174. When pressure is applied to the sensor electrode part 170, the common electrode 240 comes in physical contact with the first sensor electrode 172 and the second sensor electrode 174. Then, the first sensor electrode 172 is electrically connected to the common electrode 240, and the second sensor electrode 172 is electrically connected to the common electrode 240. The common voltage Vcom is transferred to the external sensing part. The sensing part senses the location information of the touched portion using the position of the first sensing line 120 and the second sensing line 140.

When the operation of pressing and pulling the touch panel is repeatedly performed, a persistent pressure is loaded to the first sensor electrode 172 and the second sensor electrode 174. Then, the first sensor electrode 172 and/or the second sensor electrode 174 may be damaged by the pressure, which results in an open circuit. In this embodiment, the first sensor electrode 172 and/or the second sensor electrode 174 are formed using a metal which has malleability. A malleable metal and/or alloys thereof are capable of being extended, shaped, or otherwise deformed without cracking. Malleability occurs as a result of the specific type of bond found in metals. In metallic bonds, valence shell electrons are delocalized and shared between many atoms. This is responsible for many properties of metal. The delocalized electrons allow metal atoms to slide past one another without being subjected to strong repulsive forces that would cause other materials to shatter. Repetitive pressing of a layer made from a non-malleable metal may cause cracking of the layer. However, a malleable metal can overcome pressure and elastic deformation that causes an open circuit. Thus, the sensor electrode made from the malleable metal is not easily damaged by pressing the sensor electrode repeatedly. For example, the first sensor electrode 172 and/or the second sensor electrode 174 are formed using molybdenum (Mo), molybdenum-tungsten alloy (MoW), aluminum (Al) or aluminum-neodymium alloy (Al—Nd).

Figure 2:
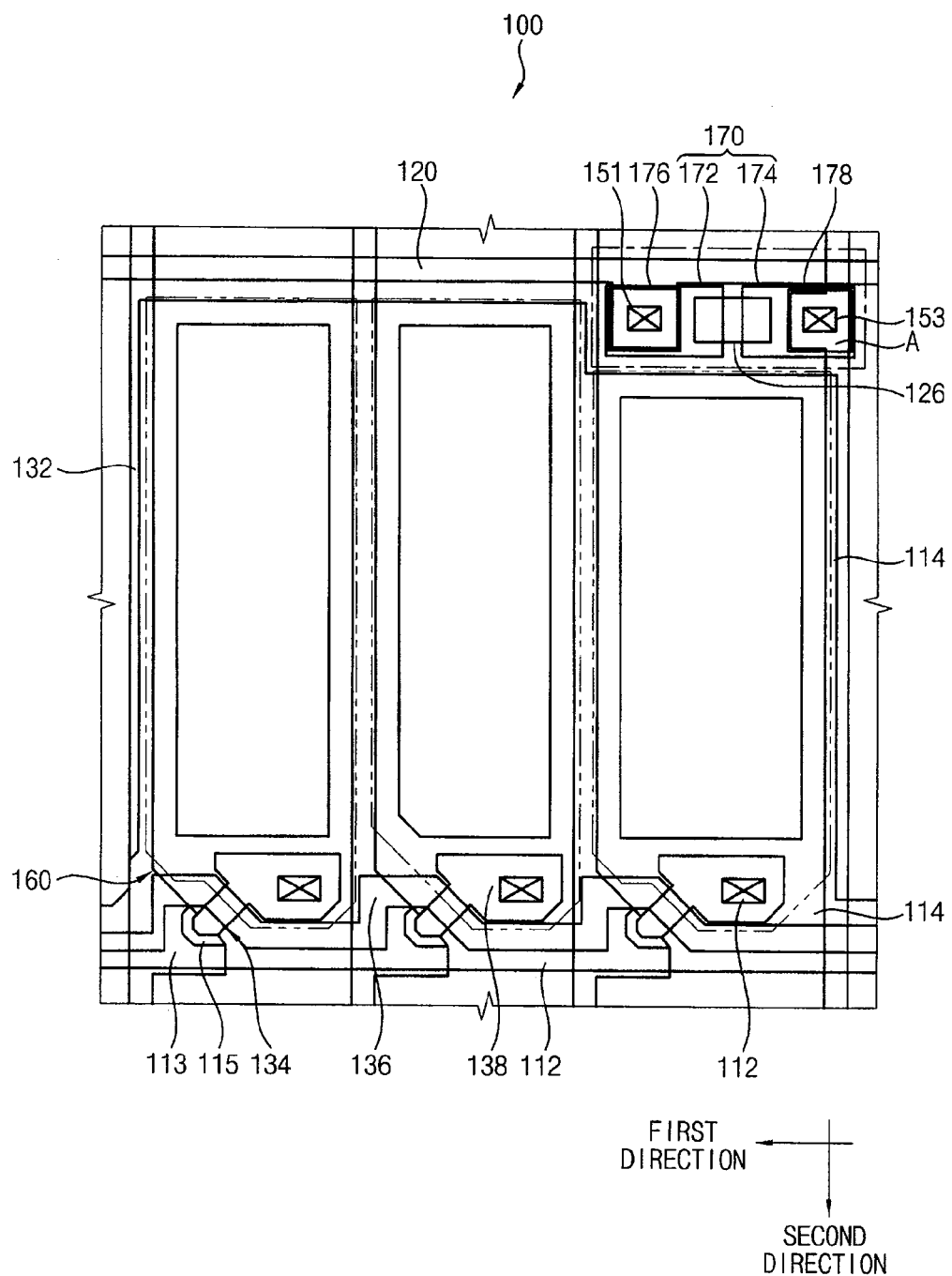
FIG. 2 is a plan view illustrating a portion of a thin film transistor substrate according to an exemplary embodiment of the invention.

FIG. 2 is a plan view illustrating a portion of a thin film transistor substrate according to an exemplary embodiment of the invention.

Referring to FIG. 2, the thin film transistor substrate 100 includes the gate line 112, the gate electrode 113, the storage line 114, the first sensor electrode 120, a dummy pattern 126, the data line 132, the source electrode 136, the drain electrode 138, the thin film transistor 134, the second sensor line 140, the pixel electrode 160 and the sensor electrode part 170.

The gate electrode 113 may be extended from the gate line 112 toward the first sensor line 120. An activation pattern 115 is formed to overlap with the gate electrode 113. The source electrode 136 is extended from the data line 132 toward the gate electrode 113, and overlaps with the activation pattern 115. The drain electrode 138 is spaced apart from the source electrode 136 and overlaps with the activation pattern 115. The drain electrode 138 also extends to overlap with a pixel electrode 160.

In the exemplary embodiment, the thin film transistor 134 may be formed through a four-step masking process, so that the activation pattern 115 may be formed below the data line 132.

The pixel electrode 160 overlaps with the drain electrode 138 of the thin film transistor 134, and is electrically connected to the drain electrode 138 through a pixel contact hole 156.

In this embodiment, the first sensor electrode 172 is connected to the first sensor line 120 through a first contact assistant member 176. The first sensor electrode 172 is connected to the first sensor line 120 through the first contact assistant member 176 via a first contact hole 151. The second sensor electrode 174 is connected to the second sensor line 140 through a second contact assistant member 178. The second sensor electrode 174 is connected to the second sensor line 140 through the second contact assistant member 178 via a second contact hole 153.

In one embodiment, the first contact assistant member 176 and/or the second contact assistant member 178 are formed using indium tin oxide (ITO) or indium zinc oxide (IZO).

The first contact assistant member 176 prevents the first sensor line 120 exposed by the first contact hole 151 from being damaged during subsequent processes. Thus, the first contact assistant member 176 may reduce the contact resistance between the first sensor line 120 and the first sensor electrode 172. The second contact assistant member 178 prevents the second sensor line 140 exposed by the second contact hole 153 from being damaged during subsequent processes. Thus, the second contact assistant member 178 may reduce the contact resistance between the second sensor line 140 and the second sensor electrode 174.

The dummy pattern 126 compensates the height difference between the protruded portion of the common electrode and adjacent portions when the protruded portion of the common electrode contacts the sensor electrode part 170. The dummy pattern 126 may be formed by one pattern or at least two patterns with at least one insulating layer interposed. For example, the dummy pattern 126 includes at least one of a first dummy pattern made from the same material as gate line 112, a second dummy pattern made from the same material as active pattern 115 or a third dummy pattern made from the same material as data line 132.

Some elements shown in FIG. 2 will be explained more in the following drawings. In each drawing, elements made from the same layer as the gate line, elements made from the same layer as the data line, elements made from the same layer as the pixel electrode will be explained. The scope of the invention, however, is not limited to the following drawings. The invention can be modified in various ways in accordance with desired objects or effects.

Figure 3:
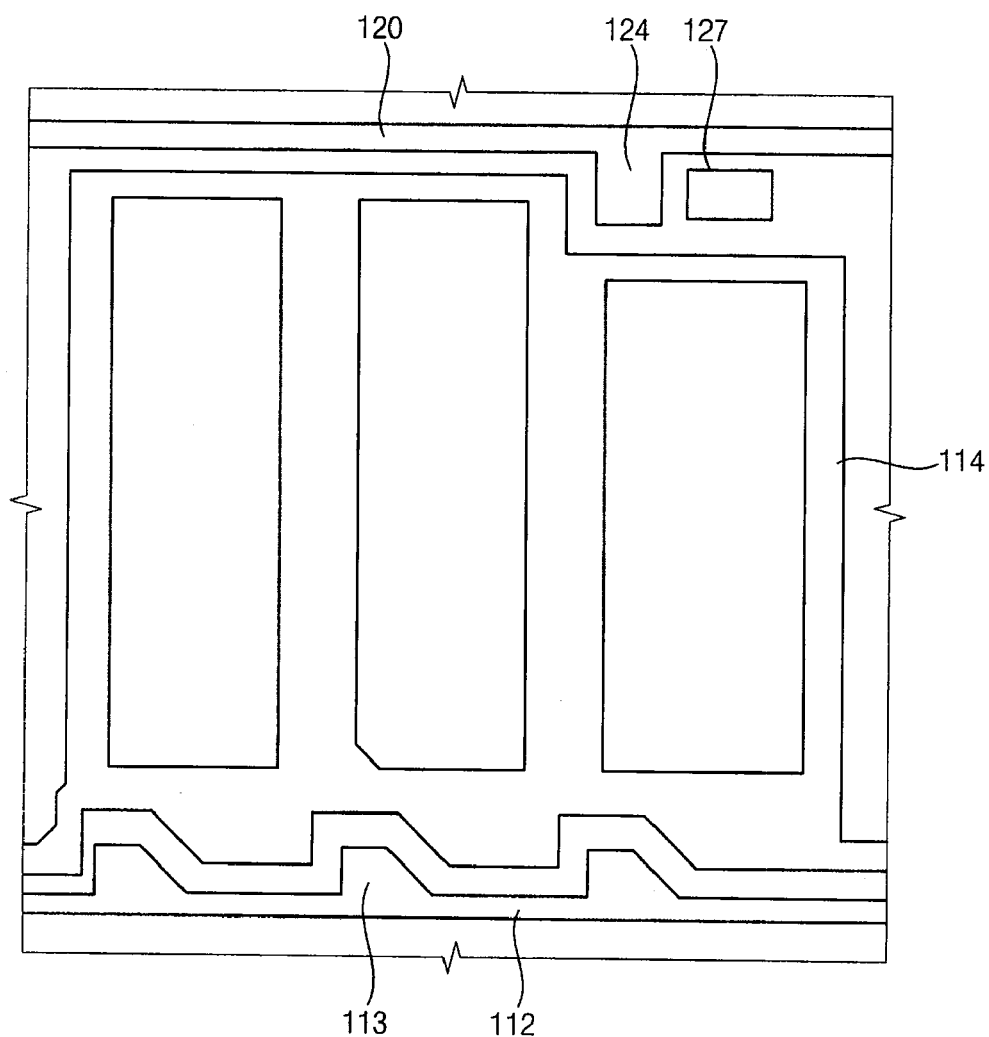
FIG. 3 is a plan view layout illustrating the gate line, the gate electrode, the storage line, the first sensor line and the first dummy pattern of FIG. 2.

FIG. 3 is a plan view layout illustrating the gate line, the gate electrode, the storage line, the first sensor line and the first dummy pattern of FIG. 2.

The gate line 112 is formed on the insulating plate 110 in a first direction. The storage line 114 is spaced apart from the gate line 112. The storage line 114 may be overlapped with an end portion of a pixel electrode 160 (see FIG. 2).

The first sensor line 120 is formed substantially parallel with the gate line 112 (i.e., in the first direction) and is spaced apart from both the gate line 112 and storage line 114. A plurality of first sensor lines 120 may be formed in the first direction.

The first sensor line 120 may be formed in predetermined numbers that correspond to one or more gate lines 112. For example, the first sensor line 120 may be formed for every six gate lines 112 in sequence.

A first protrusion portion 124 protrudes from the first sensor line 120 toward a second direction extending away from the first sensor line 120. That is, the first protrusion portion 124 may protrude from the first sensor line 120 towards a second direction when viewed in a plan view layout. The second direction may be substantially perpendicular to the first direction.

The first dummy pattern 126 is formed on the first insulating plate 110 and is spaced apart from the first sensor line 120 and the storage line 114. For example, the first dummy pattern 126 is formed substantially parallel with the first sensor line 120, and is adjacent to, and spaced apart from, the first protrusion portion 124. The first dummy pattern 126 may be formed to have, e.g., a substantially square or rectangular shape. If rectangular in shape, the length may extend in the first direction.

Figure 4:
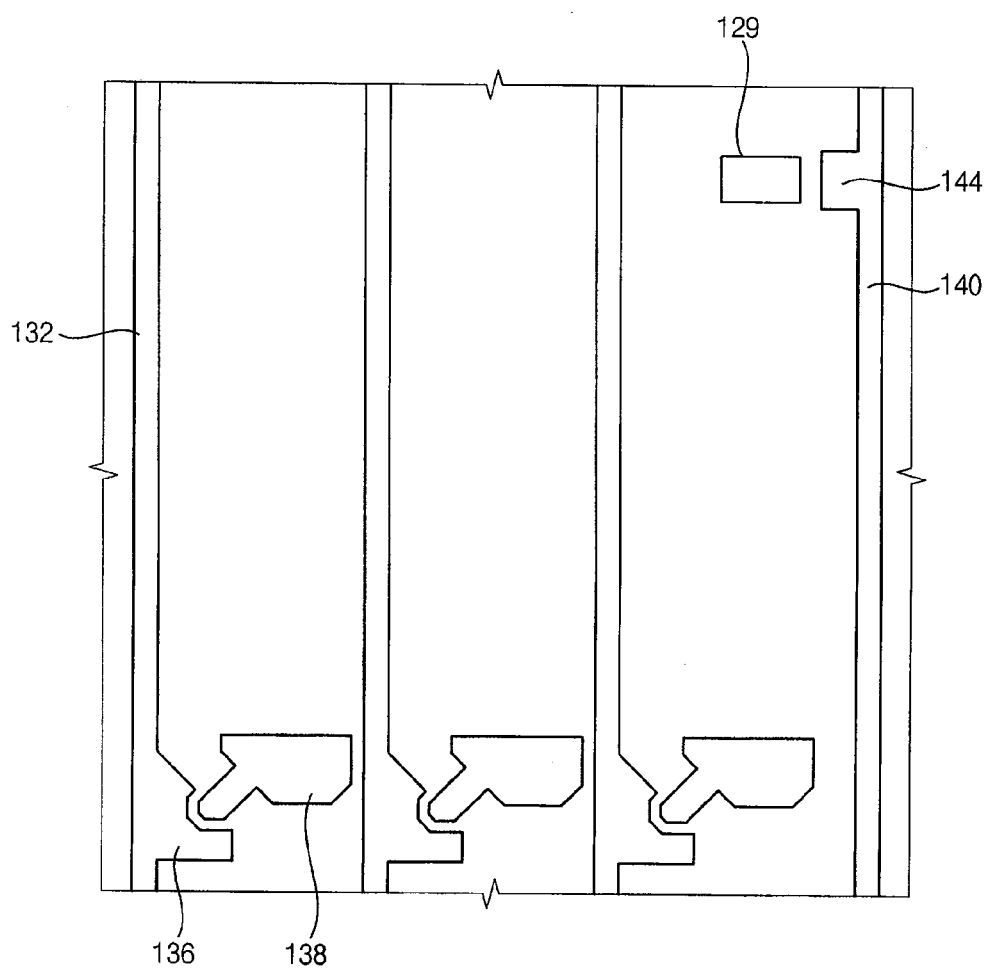
FIG. 4 is a plan view layout illustrating the data line, the source electrode, the drain electrode, the third dummy pattern and the second sensor line of FIG. 2.

FIG. 4 is a plan view layout illustrating the data line, the source electrode, the drain electrode, the third dummy pattern and the second sensor line of FIG. 2.

Referring to FIG. 4, the data lines 132 may be formed on the gate insulation layer 130 (see FIG. 7) in the second direction. The second direction may be substantially perpendicular to the first direction.

The second sensor line 140 is spaced apart from the data line 132 and is substantially parallel with the data line 132 (i.e., in the second direction). A plurality of the second sensor lines 140 may be formed in the second direction.

The second sensor line 140 may be formed in predetermined numbers that correspond to one or more data lines 132. For example, the second sensor line 140 may be formed for every six data lines 132 in sequence.

A second protrusion portion 144 protrudes from the second sensor line 140 toward the first direction extending away from the second sensor line 140. That is, the second protrusion portion 144 may protrude from the second sensor line 140 toward the first direction when viewed from a plan view.

The second dummy pattern 129 is formed to be spaced apart from the second sensor line 140 and the data line 132. For example, the second dummy pattern 129 is spaced apart from, and substantially aligned with, the second protrusion portion 144 in the first direction.

Figure 5:
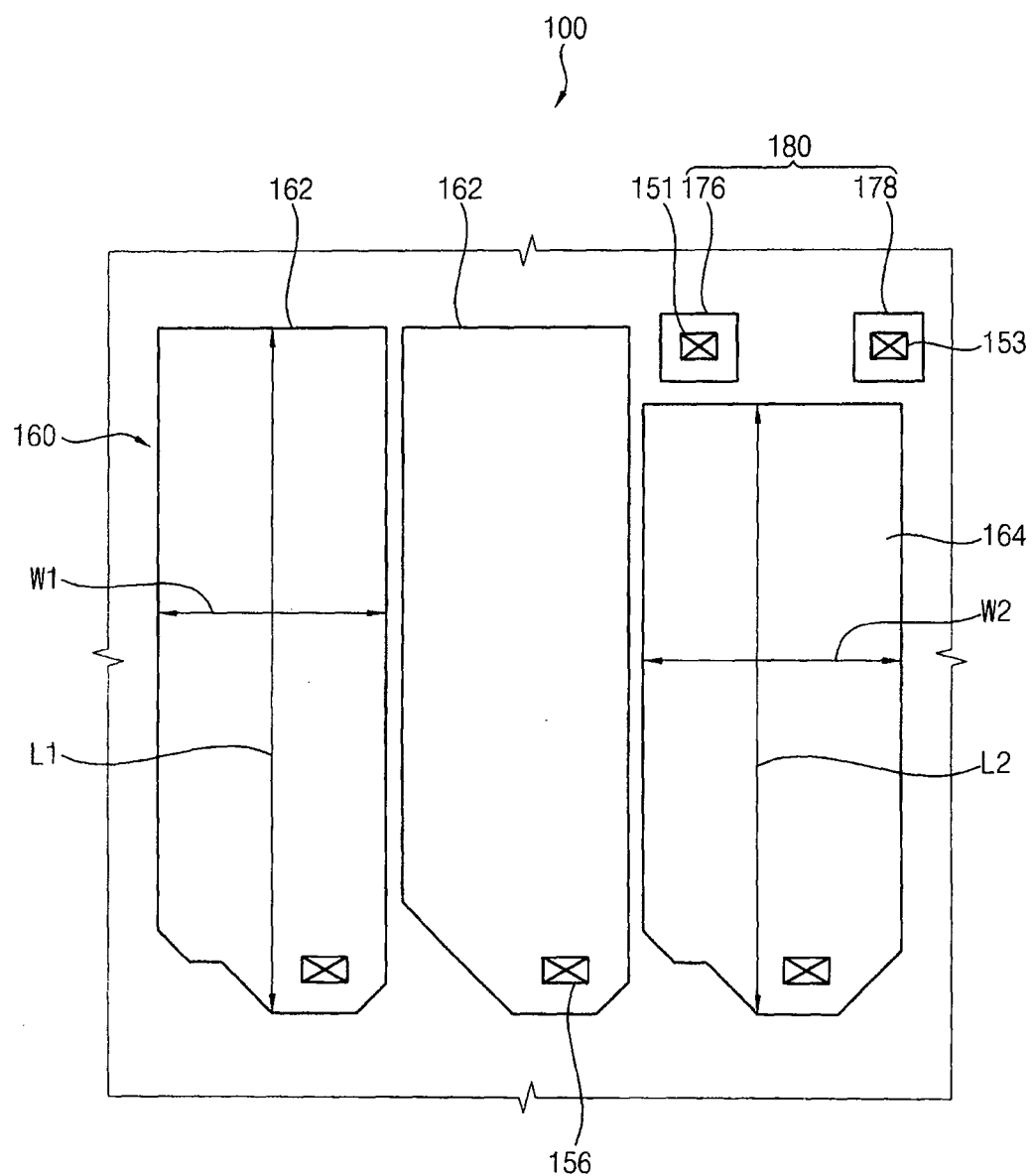
FIG. 5 is a plan view layout illustrating the pixel electrode and the contact assistant member of FIG. 2.

FIG. 5 is a plan view layout illustrating the pixel electrode and the contact assistant member of FIG. 2.

Referring to FIG. 5, the pixel electrode 160 is formed in a unit area. The unit area means a pixel area expressing one color. In this embodiment, the unit area denotes the area defined by the gate line and the data line. However, the definition of the unit area is not limited to the above definition. In another embodiment, the gate line and the data line may overlap with the unit area. The pixel electrode 160 is electrically connected to the thin film transistor 134. The pixel electrode 160 may include a transparent material.

The contact assistance member 180 is formed to be spaced apart from the pixel electrode 160. For example, the contact assistance member 180 is formed in a region of the unit areas. The first contact assistance member 176 is electrically connected to the first sensor line 120, and the second contact assistance member 178 is electrically connected to the second sensor line 140. The contact assistance member 180 may be formed adjacent to the pixel electrode 160 in a region of the unit area.

Unit areas in which the contact assistance member 180 is not formed are referred to herein as a plurality of first unit areas. Unit areas in which the contact assistance member 180 is formed are referred to herein as a plurality of second unit areas. The pixel electrodes 160 include a plurality of first pixel electrodes 162 formed in the first unit areas and a plurality of second pixel electrodes 164 formed in the second unit areas.

To accommodate the contact assistance member 180, a size of the first pixel electrode 162 may be different (e.g., greater) from a size of the second pixel electrode 164. Alternatively, the size of the first pixel electrode 162 may be equal to the size of the second pixel electrode 164. That is, each of the pixel electrodes 160 formed in each of the unit areas is equal to each other in size. Furthermore, a width of the first direction of the second unit area may be greater than a width of the first direction of the first unit area.

Accordingly, the first width W1 of the first direction of the first pixel electrodes 162 may be smaller than the second width W2 of the first direction of the second pixel electrodes 164, and the first length L1 of the second direction of the first pixel electrodes 162 may be greater than the second length L2 of the second direction of the second pixel electrodes 164.

Figure 6:
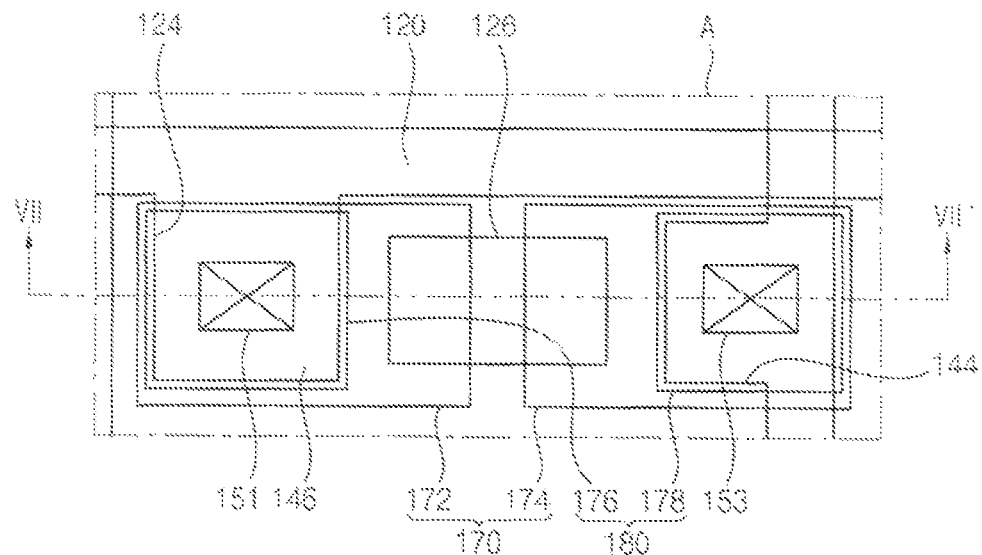
FIG. 6 is an enlarged plan view illustrating a portion "A" of FIG. 2.

FIG. 6 is an enlarged plan view illustrating a portion "A" of FIG. 2. The first sensor line 120, the second sensor line 140, the dummy pattern 126, the sensor electrode part 170 and the contact assistant member 180 are illustrated in FIG. 6.

As indicated above, the first protrusion portion 124 is extended from the first sensor line 120.

For example, the first protrusion portion 124 is extended in a direction that is substantially parallel with the direction of the data line 132. The first protrusion portion 124 may have a substantially square or rectangular shape when viewed from a plan view.

The dummy pattern 126 may have a substantially square or rectangular shape when viewed from a plan view. In this embodiment, the dummy pattern 126 includes a first dummy pattern made from the same material as the gate line 112, a second dummy pattern made from the same material as the active pattern 115 and a third dummy pattern made from the same material as the data line 132.

The second protrusion portion 144 is extended from the second sensor line 140.

The second protrusion portion 144 may have a substantially square or rectangular shape when viewed from a plan view.

The first sensor electrode 172 is formed to be overlapped with the first protrusion portion 124, and electrically connected to the first protrusion portion 124 through a first contact hole 151. The first sensor electrode 172 may have a substantially square or rectangular shape when viewed from a plan view, and may have a size that completely covers the first protrusion portion 124.

The second sensor electrode 174 is formed to be overlapped with the second protrusion portion 144, and electrically connected to the second protrusion portion 144 through the second contact hole 153. The second sensor electrode 174 may have a substantially square or rectangular shape when viewed from a plan view.

The first sensor electrode 172 is connected to the first sensor line 120 through the first contact assistant member 176. The first contact assistant member 176 connects the first sensor electrode 172 with the first sensor line 120 via the first contact hole 151. In particular, the first sensor electrode 172 is connected to the first protrusion portion 124. The second sensor electrode 174 is connected to the second sensor line 140 through the second contact assistant member 178. The second contact assistant member 178 connects the second sensor electrode 178 with the second sensor line 140 via the second contact hole 153. In particular, the second sensor electrode 174 is connected to the second protrusion portion 144. The first contact assistant member 176 has a configuration that substantially covers the first protrusion portion 124. The second contact assistant member 178 has a configuration that substantially covers the second protrusion portion 144.

The first sensor electrode 172 and the second sensor electrode 174 are formed using a material which has malleability. A malleable metal can overcome pressure and elastic deformation. Thus, the sensor electrode made from the malleable metal is not easily damaged by pressing the sensor electrode repeatedly.

Figure 7:
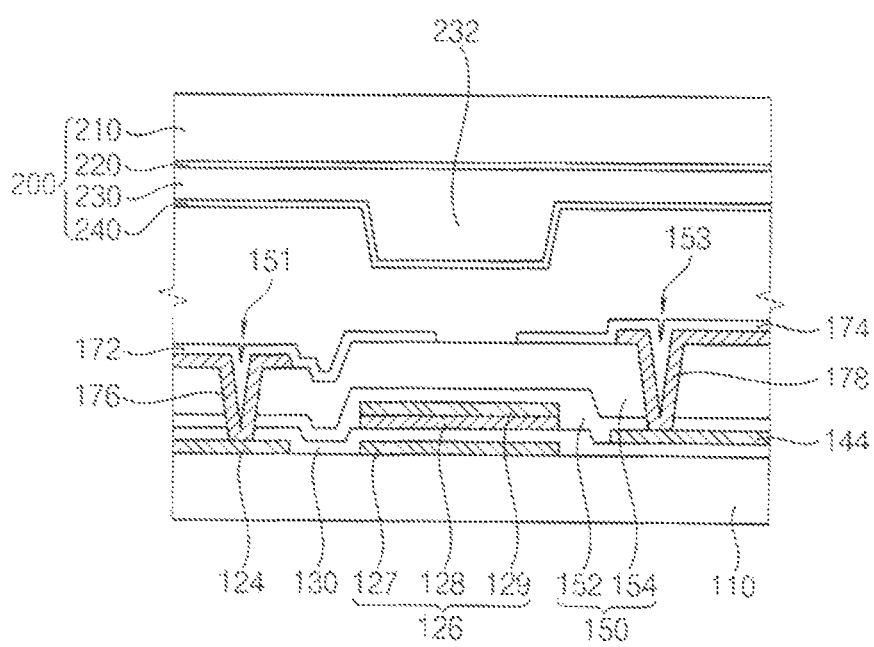
FIG. 7 is a cross-sectional view of the thin film transistor substrate taken along the line VII-VII' of FIG. 6 assembled with an opposite substrate.

FIG. 7 is a cross-sectional view of the thin film transistor substrate taken along the line VII-VII' of FIG. 6 assembled with an opposite substrate.

Referring to FIG. 7, the display device according to an embodiment of the invention includes the thin film transistor substrate 100, an opposite substrate 200 and a liquid crystal layer (not shown).

The first insulating plate 110 may be formed to have a plate shape. The first insulating plate 110 may be formed from, for example, glass, quartz, synthetic resin, etc.

The first protrusion portion 124 and the first dummy pattern 127 are formed on the first insulating plate 110 together with the gate line and the first sensor line.

The gate insulation layer 130 is formed on the first insulating plate 110 to cover the gate line, the storage line, the first sensor line and the first dummy pattern 127. The gate insulation layer 130 may include an inorganic insulation. For example, the gate insulation layer 130 may include a silicon nitride (SiNx) layer and a silicon oxide (SiOx) layer.

A second protrusion portion 144, the second dummy pattern 128 and the third dummy pattern 129 are formed on the gate insulation layer 130 together with the data line and the second sensor line. In one embodiment, the second dummy pattern 128 and the third dummy pattern 129 are formed using one light exposure mask. The second dummy pattern 128 is formed as the same layer as the active pattern 115.

The passivation layer 150 is formed on the gate insulation layer 130 to cover the second protrusion portion 144, the second dummy pattern 128 and the third dummy pattern 129. The passivation layer 150 may include a single layer structure. Alternatively, the passivation layer 150 may include a double layer structure. For example, the passivation layer 150 may include an inorganic passivation layer 152 covering the second protrusion portion 144, the second dummy pattern 128 and the third dummy pattern 129, and an organic passivation layer 154 formed on the inorganic insulation layer 152. Here, a thickness of the organic passivation layer 154 may be thicker than that of the inorganic passivation layer 152.

The first contact assistant member 176 and the second contact assistant member 178 are formed on the passivation layer 150. The first contact assistance member 176 directly contacts the first protrusion portion 124 through the first contact hole 151. The first contact hole 151 is formed after the passivation layer 150 and the gate insulation layer 130 are etched. The second contact assistance member 178 directly contacts the second protrusion portion 144 through the first contact hole 154. The second contact hole 153 is formed after the passivation layer 150 is etched.

The first sensor electrode 172 is formed on the first contact assistant member 176, and the second sensor electrode 174 is formed on the second contact assistant member 178. At least a portion of the first sensor electrode 172 covers the first contact assistant member 176, and at least a portion of the second sensor electrode 174 covers the second contact assistant member 178. The first sensor electrode 172 and/or the second sensor electrode 174 are formed using a metal which has malleability. The malleable metal can overcome pressure and elastic deformation. Thus, the sensor electrode made from the malleable metal is not easily damaged by pressing the sensor electrode repeatedly. For example, the first sensor electrode 172 and/or the second sensor electrode 174 are formed using molybdenum (Mo), molybdenum-tungsten alloy (MoW), aluminum (Al) or aluminum-neodymium alloy (Al—Nd).

A reflecting layer (not shown) may further be formed on the first sensor electrode 172 and/or the second sensor electrode 174. The reflecting layer reflects external light and is formed on a reflecting area of a transmissive display device. The reflecting layer may be formed in the same shape as the first sensor electrode 172 and/or the second sensor electrode 174. In one embodiment, the reflecting electrode includes an aluminum-neodymium alloy (Al—Nd).

The opposite substrate 200 includes a second insulating plate 210, a light-blocking layer 220, a color filter (not shown), an over-coating layer 230, and a common electrode 240.

The second insulating plate 210 is disposed to face the first insulating plate 110. The second insulating plate 210 may be formed to have a plate shape. The second insulating plate 210 may include glass, quartz, synthetic resin, etc.

The light-blocking layer 220 is formed on a first surface of the second insulating plate 210 that faces the first insulating plate 110. The light-blocking layer 220 may be formed to cover the gate line 112, the data line 132, the first sensor line 120, the second sensor line 140, the storage line 114 and the thin film transistor 134 of the thin film transistor substrate 100.

The color filter is formed on the second insulating plate 210 to cover the light-blocking layer 220. For example, the color filter may have a red color filter, a green color filter and a blue color filter corresponding to the pixel electrodes 160 of the thin film transistor substrate 100, respectively.

The over-coating layer 230 is formed to cover the color filter. The over-coating layer 230 includes a sensor protrusion 232 extending toward the sensor electrode part 170. The sensor protrusion 232 protrudes at a mid-section of the over-coating layer 230 and its length is substantially the same or less than the length of the sensor electrode part 170; that is, along the first direction. A length of the first direction of the sensor protrusion 232 may be in a range of about 30 micrometers to about 60 micrometers.

The liquid crystal layer is interposed between the thin film transistor substrate 100 and the opposite substrate 200, and rearranged by an electric field formed between the thin film transistor substrate 100 and the opposite substrate 200. Thus configured, when an electric field is applied to the liquid crystal layer 300, an arrangement of liquid crystal molecules of the liquid crystal layer 300 is altered to change optical transmissivity, so that an image is displayed.

Figure 8:
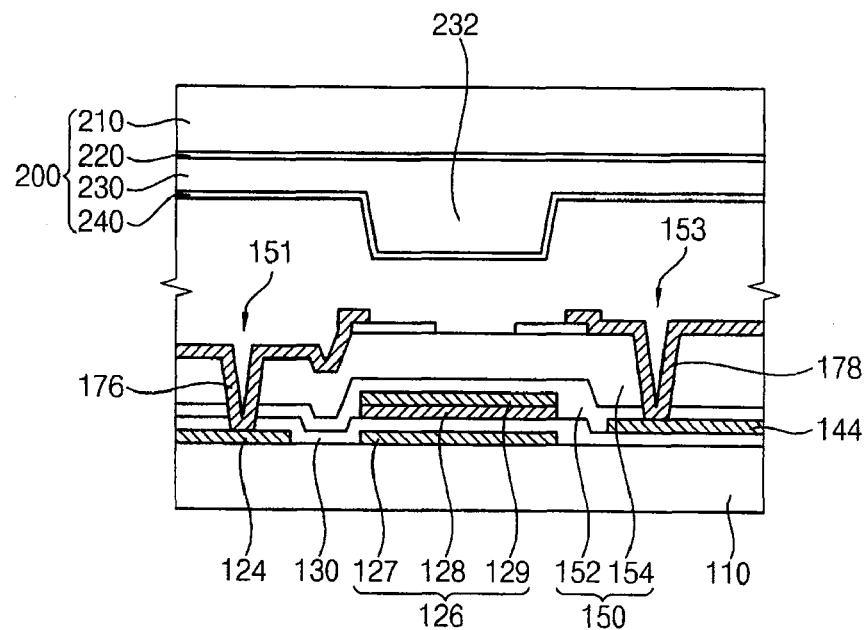
FIG. 8 is a cross-sectional view of the sensor portion of a display device according to another embodiment of the invention.

FIG. 8 is a cross-sectional view of the sensor portion of a display device according to another embodiment of the invention.

Elements in FIG. 8 are identical to those in FIG. 7 except for a first contact assistant member 176', a first sensor electrode 172', a second contact assistant member 178' and a second sensor electrode 174'.

In this embodiment, the first contact assistant member 176' contacts the first protrusion portion 124. At least a portion of the first sensor electrode 172' is formed under the first contact assistant member 176'. The second contact assistant member 178' contacts the second protrusion portion 144. At least a portion of the second sensor electrode 174' is formed under the second contact assistant member 178'

In manufacturing the display device according to the invention, the organic passivation layer 154 is formed, and then the first contact hole 151 and the second contact hole 153 are formed. Next, the first sensor electrode 172' and the second sensor electrode 174 are formed. Then, the first contact assistant member 176' and the second contact assistant member 178' are formed.

In one embodiment, the first contact assistant member 176' and/or the second contact assistant member 178' are formed using indium tin oxide (ITO) or indium zinc oxide (IZO).

In this embodiment, the first sensor electrode 172' and/or the second sensor electrode 174' are formed using a metal which has malleability. For example, the first sensor electrode 172' and/or the second sensor electrode 174' are formed using molybdenum (Mo), molybdenum-tungsten alloy (MoW), aluminum (Al) or aluminum-neodymium alloy (Al—Nd). In another embodiment, the first sensor electrode 172' and/or the second sensor electrode 174' may have a first layer including molybdenum (Mo) and a second layer including aluminum-neodymium alloy (Al—Nd). In one embodiment, the layer including molybdenum (Mo) is the lower layer and the layer including aluminum-neodymium alloy (Al—Nd) is the upper layer.

Figure 9:
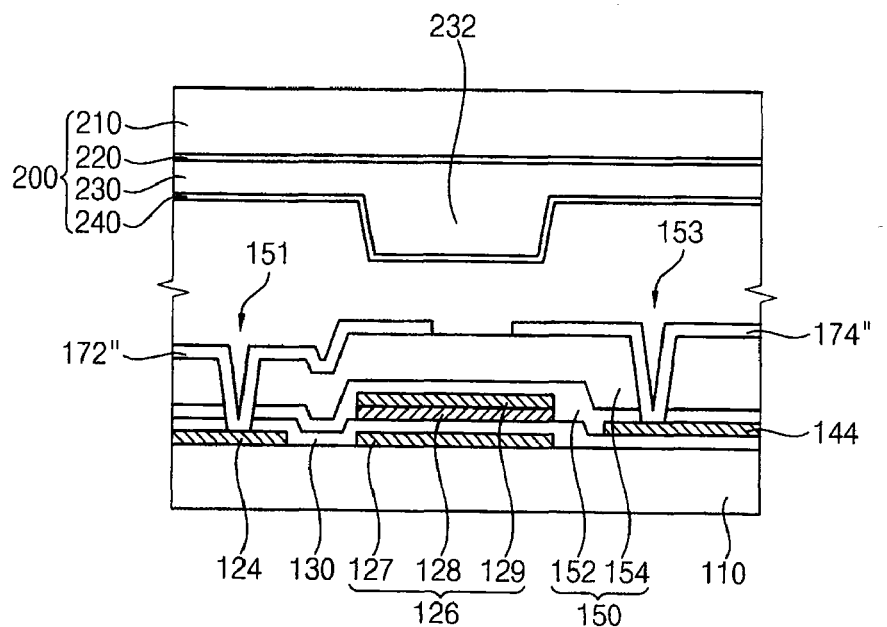
FIG. 9 is a cross-sectional view of the sensor portion of a display device according to another embodiment of the invention.

FIG. 9 is a cross-sectional view of the sensor portion of a display device according to another embodiment of the invention.

Elements in FIG. 9 are identical to those in FIG. 7 except for a first contact assistant member 176", a first sensor electrode 172", a second contact assistant member 178" and a second sensor electrode 174".

In this embodiment, the first sensor electrode 172" directly contacts the first protrusion portion 124, and the second sensor electrode 174" directly contacts the second protrusion portion 144.

In one embodiment, the first contact assistant member 176" and/or the second contact assistant member 178" are formed using indium tin oxide (ITO) or indium zinc oxide (IZO).

In this embodiment, the first sensor electrode 172" and/or the second sensor electrode 174" are formed using a metal which has malleability. For example, the first sensor electrode 172" and/or the second sensor electrode 174" are formed using molybdenum (Mo), molybdenum-tungsten alloy (MoW), aluminum (Al) or aluminum-neodymium alloy (Al—Nd).

A capping layer (not shown) may further be formed on the first sensor electrode 172" and the second sensor electrode 174". In one embodiment, the capping layer includes indium tin oxide (ITO). The capping layer enables the first sensor electrode 172" and the second sensor electrode 174" to endure repetitive pressing action.

As described above, the sensor electrode part is formed using a metal which has malleability. The malleable metal can overcome pressure and elastic deformation. Thus, the sensor electrode part made from the malleable metal is not easily damaged by pressing the sensor electrode repeatedly.

Although the exemplary embodiments of the invention have been described, it is understood that the invention should not be limited to these exemplary embodiments but various changes and modifications can be made by one ordinary skilled in the art in the spirit and scope of the invention as hereinafter claimed.

What is claimed is:

1. A display substrate comprising:
a first sensor line;
a first protrusion portion protruding from the first sensor line;
a first sensor electrode formed on a passivation layer and comprising a malleable metal, the first sensor electrode electrically connected to the first protrusion portion;
a dummy pattern partially overlapping the first sensor electrode; and
a first contact assistant member that connects the first protrusion portion with the first sensor electrode,
wherein the first contact assistant member comprises indium tin oxide or indium zinc oxide.

2. The display substrate of claim 1, wherein at least a portion of the first contact assistant member contacts the first protrusion portion and at least a portion of the first sensor electrode covers the first contact assistant member.

3. The display substrate of claim 2, further comprising a reflecting layer formed on the first sensor electrode, and wherein the reflecting layer has the same configuration as the first sensor electrode.

4. The display substrate of claim 1, wherein at least a portion of the first contact assistant member contacts the first protrusion portion and at least a portion of the first sensor electrode is disposed under the first contact assistant member.

5. The display substrate of claim 1, wherein the first sensor electrode comprises molybdenum (Mo), molybdenum alloy, aluminum (Al) or aluminum alloy.

6. The display substrate of claim 1, wherein the first sensor electrode comprises at least one layer of metal.

7. The display substrate of claim 1, further comprising:
a gate line substantially parallel with the first sensor line;
a data line crossing the gate line; and
a thin film transistor connected to the gate line and the data line;
a second sensor line substantially parallel with the data line;
a second protrusion portion protruded from the second sensor line; and
a second sensor electrode electrically connected to the second protrusion portion.

8. A thin film transistor substrate comprising:
an insulating plate;
a gate line formed on the insulating plate;
a data line crossing the gate line;
a thin film transistor connected to the gate line and the data line;
a first sensor line substantially parallel with the gate line;
a first protrusion portion protruded from the first sensor line;
a passivation layer formed over the first protrusion portion;
a first contact assistant member in direct contact with the first protrusion portion;
a first sensor electrode formed on the passivation layer, contacting the first contact assistant member; and
a dummy pattern partially overlapping the first sensor electrode.

9. The thin film transistor substrate of claim 8, wherein the first sensor electrode is formed on at least a portion of the first contact assistant member.

10. The thin film transistor substrate of claim 8, wherein at least a portion of the first contact assistant member is formed on the first sensor electrode.

11. The thin film transistor substrate of claim 8, wherein the first contact assistant member comprises indium tin oxide or indium zinc oxide and the first sensor electrode comprises molybdenum (Mo).

12. A display device comprising:
a first insulating plate;
a gate line formed on the first insulating plate;
a data line crossing the gate line;
a thin film transistor connected to the gate line and the data line;
a first sensor line substantially parallel with the gate line;

a first protrusion portion protruded from the first sensor line;

a first sensor electrode electrically connected to the first protrusion portion, wherein the first sensor electrode comprises a malleable metal;

a second sensor line substantially parallel with the data line;

a second protrusion portion protruded from the second sensor line;

a second sensor electrode electrically connected to the second protrusion portion, wherein the second sensor electrode comprises a malleable metal;

a second insulating plate;

an organic layer formed on the second insulating plate;

a third protrusion portion vertically protruded from the organic layer; and a common electrode formed on the organic layer and on the protrusion.

* * * * *